United States Patent
Cheng et al.

(10) Patent No.: US 10,083,907 B2
(45) Date of Patent: Sep. 25, 2018

(54) METHOD AND STRUCTURE FOR FORMING ON-CHIP ANTI-FUSE WITH REDUCED BREAKDOWN VOLTAGE

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/495,451

(22) Filed: Apr. 24, 2017

(65) Prior Publication Data
US 2017/0229394 A1    Aug. 10, 2017

Related U.S. Application Data

(62) Division of application No. 14/826,937, filed on Aug. 14, 2015, now Pat. No. 9,633,943.

(51) Int. Cl.
*H01L 23/525*    (2006.01)
*H01L 21/84*    (2006.01)
(Continued)

(52) U.S. Cl.
CPC .... *H01L 23/5252* (2013.01); *H01L 21/76224* (2013.01); *H01L 21/84* (2013.01);
(Continued)

(58) Field of Classification Search
CPC ..... H01L 23/525; H01L 21/762; H01L 21/84; H01L 27/12; H01L 29/06; H01L 29/66; H01L 29/78
(Continued)

(56) References Cited

U.S. PATENT DOCUMENTS 5,502,000 A    3/1996  Look et al.
5,915,171 A    6/1999  Sheu
(Continued)

FOREIGN PATENT DOCUMENTS

JP    2008545276    12/2008
JP    4615884    10/2010
(Continued)

OTHER PUBLICATIONS

List of IBM Patents or Patent Applications Treated As Related, dated Apr. 24, 2017, 2 Pages.

*Primary Examiner* — Sheng Zhu
(74) *Attorney, Agent, or Firm* — Scully, Scott, Murphy & Presser, P.C.; Daniel P. Morris, Esq.

(57)    ABSTRACT

A fully depleted field effect transistor (FET) and an anti-fuse structure are provided on a same chip. The fully depleted FET and the anti-fuse structure share a same high dielectric (k) constant dielectric material. The anti-fuse structure contains a faceted epitaxial doped semiconductor material as a bottom electrode, a high k dielectric material portion, and a gate electrode material portion as a top electrode. The sharp corners of the faceted epitaxial doped semiconductor material cause electric field concentration, which aid in the reduction of the breakdown voltage of the anti-fuse structure.

20 Claims, 7 Drawing Sheets

(51) Int. Cl.
*H01L 21/762* (2006.01)
*H01L 27/12* (2006.01)
*H01L 29/06* (2006.01)
*H01L 29/66* (2006.01)
*H01L 29/78* (2006.01)

(52) U.S. Cl.
CPC ...... *H01L 27/1203* (2013.01); *H01L 29/0615* (2013.01); *H01L 29/0649* (2013.01); *H01L 29/66545* (2013.01); *H01L 29/66568* (2013.01); *H01L 29/7838* (2013.01)

(58) Field of Classification Search
USPC .......................... 257/57, 348; 438/157, 601
See application file for complete search history.

(56) References Cited

U.S. PATENT DOCUMENTS

| | | |
|---|---|---|
| 6,130,469 A | 10/2000 | Bracchitta et al. |
| 6,396,120 B1 | 5/2002 | Bertin et al. |
| 6,396,121 B1 | 5/2002 | Bertin et al. |
| 7,453,755 B2 | 11/2008 | Cleeves |
| 7,612,454 B2 | 11/2009 | Guo et al. |
| 2012/0187528 A1 | 7/2012 | Cheng et al. |
| 2013/0153960 A1 | 6/2013 | Yang |
| 2013/0270560 A1 | 10/2013 | Cheng et al. |
| 2013/0270561 A1 | 10/2013 | Cheng et al. |
| 2013/0307115 A1 | 11/2013 | Filippi et al. |
| 2014/0179070 A1 | 6/2014 | Yang |
| 2015/0228761 A1 | 8/2015 | Cheng et al. |

FOREIGN PATENT DOCUMENTS

| | | |
|---|---|---|
| KR | 1020070113859 | 11/2007 |
| KR | 1020140003147 | 1/2014 |

METHOD AND STRUCTURE FOR FORMING ON-CHIP ANTI-FUSE WITH REDUCED BREAKDOWN VOLTAGE

BACKGROUND

The present application relates to programmable anti-fuse structures and more particularly to an on-chip programmable anti-fuse structure having reduced breakdown voltage. The present application also relates to a method of forming such a programmable anti-fuse structure.

An anti-fuse is an electrical device that performs the opposite function to a fuse. Whereas a fuse starts with a low resistance and is designed to permanently break an electrically conductive path (typically when the current through the path exceeds a specified limit), an anti-fuse starts with a high resistance and is designed to permanently create an electrically conductive path (typically when the voltage across the anti-fuse exceeds a certain level).

Programmable anti-fuse structures are used in a variety of circuit applications. It is highly desired to fabricate on-chip anti-fuse structures during complementary metal oxide semiconductor (CMOS) fabrication to minimize process costs and improve system integration. In such applications, the gate dielectric and the anti-fuse dielectric are typically composed of a same dielectric material. However, the breakdown voltage of a conventional planar anti-fuse structure with a gate dielectric is typically too high. As such, there is a need for providing improved on-chip anti-fuse structures that avoid the drawbacks mentioned above.

SUMMARY

A fully depleted field effect transistor (FET) and an anti-fuse structure are provided on a same chip. The fully depleted FET and the anti-fuse structure share a same high dielectric constant (k) material. By "fully depleted" it is meant that the semiconductor material layer that is located between the gate dielectric of the FET and the buried insulator layer is extremely thin such that the depletion region of the FET can cover the whole thickness of the semiconductor material layer. By "high k" it is meant a dielectric material that has a dielectric constant that is greater than the dielectric constant of silicon dioxide. The anti-fuse structure contains a faceted epitaxial doped semiconductor material as a bottom electrode, a high k dielectric material portion, and a gate electrode material portion as a top electrode. The sharp corners of the faceted epitaxial doped semiconductor material cause electric field concentration, which aid in the reduction of the breakdown voltage of the anti-fuse structure.

In one aspect of the present application, a semiconductor structure is provided. In one embodiment of the present application, a semiconductor structure is provided that includes a field effect transistor located on a first semiconductor material portion that is present on a first portion of a topmost surface of an insulator layer. The field effect transistor comprises a functional gate structure of, from bottom to top, a first portion of a high k dielectric material and a first portion of a gate electrode material. The structure of the present application further includes an anti-fuse structure located on a second semiconductor material portion that is present on a second portion of the topmost surface of the insulator layer. The anti-fuse structure comprises, from bottom to top, a faceted epitaxial doped semiconductor material structure, a second portion of the high k dielectric material and a second portion of the gate electrode material.

In another aspect of the present application, a method of forming a semiconductor structure is provided. In one embodiment of the present application, a method is provided that includes providing a substrate including a first semiconductor material portion located on a first portion of a topmost surface of an insulator layer, and a second semiconductor material portion located on a second portion of the topmost surface of the insulator layer. A sacrificial gate structure is then formed on a surface of the first semiconductor material portion. Next, faceted epitaxial doped semiconductor material structures are formed on exposed portions of the first semiconductor material portion and on exposed portions of the second semiconductor material portion. A middle-of-the-line (MOL) dielectric is formed surrounding the sacrificial gate structure and atop the faceted epitaxial doped semiconductor material structures, the first semiconductor material portion and the second semiconductor material portion. Next, an opening is formed within the MOL dielectric exposing the faceted epitaxial doped semiconductor material structure on the second semiconductor material portion. The sacrificial gate structure is then removed to provide a gate cavity. Next, a contiguous layer of a high k dielectric material and a contiguous layer of gate electrode material are formed within the gate cavity and the opening and atop the MOL dielectric. Thereafter, portions of the contiguous layer of the high k dielectric material and portions of the contiguous layer of gate electrode material are removed from atop the MOL dielectric to provide a functional gate structure in the gate cavity and an anti-fuse structure in the opening.

DETAILED DESCRIPTION

Figure 1:
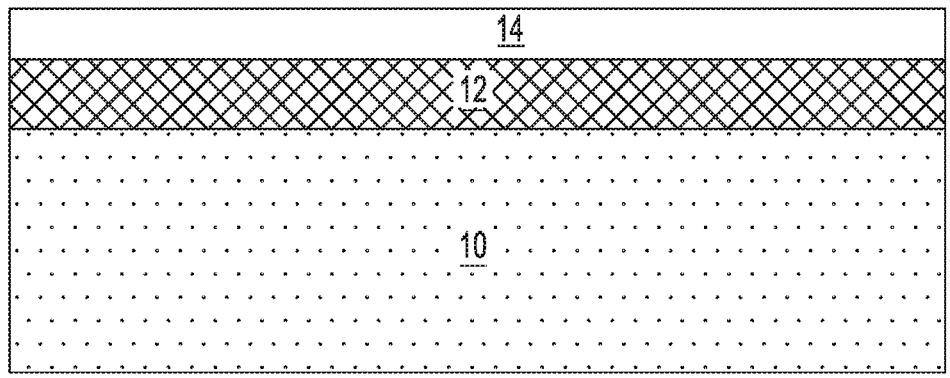
FIG. 1 is a cross sectional view of an exemplary semiconductor structure including a semiconductor-on-insulator (SOI) substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a semiconductor-on-insulator (SOI) substrate that can be employed in accordance with an embodiment of the present application. The SOI substrate that can be used in the present application includes, from bottom to top, a handle substrate 10, an insulator layer 12 and a semiconductor material layer 14. In some embodiments of the present application, the handle substrate 10 can be omitted.

In the embodiment illustrated in FIG. 1, the semiconductor material layer 14 is present on a topmost surface of the insulator layer 12, and the insulator layer 12 is present on a topmost surface of the handle substrate 10. The handle substrate 10 provides mechanical support to the insulator layer 12 and the semiconductor material layer 14.

In some embodiments of the present application, the handle substrate 10 and the semiconductor material layer 14 of the SOI substrate may comprise a same semiconductor material. In other embodiments of the present application, the handle substrate 10 and the semiconductor material layer 14 of the SOI substrate may comprise a different semiconductor material. The term "semiconductor" as used herein in connection with the semiconductor material of the handle substrate 10 and the semiconductor material layer 14 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 10 and the semiconductor material layer 14. In one embodiment, the handle substrate 10 and the semiconductor material layer 14 are both comprised of silicon. In some embodiments, the handle substrate 10 is a non-semiconductor material including, for example, a dielectric material and/or a conductive material.

The handle substrate 10 and the semiconductor material layer 14 may have the same or different crystal orientation. For example, the crystal orientation of the handle substrate 10 and/or the semiconductor material layer 14 may be {100}, {110}, or {111}. Other crystallographic orientations besides those specifically mentioned can also be used in the present application. The handle substrate 10 of the SOI substrate may be a single crystalline semiconductor material, a polycrystalline material, or an amorphous material. Typically, the semiconductor material layer 14 is a single crystalline semiconductor material. In some embodiments (not shown), the semiconductor material layer 14 that is located atop the insulator layer 12 can be processed to include semiconductor regions having different crystal orientations.

The insulator layer 12 of the SOI substrate may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride.

The SOI substrate may be formed utilizing standard processes including for example, SIMOX (Separation by IMplantation of OXygen) or layer transfer. When a layer transfer process is employed, an optional thinning step may follow the bonding of two semiconductor wafers together.

The optional thinning step reduces the thickness of the semiconductor material layer to a layer having a thickness that is more desirable.

In some embodiments, the thickness of semiconductor material layer 14 of the SOI substrate is from 5 nm to 50 nm. Other thicknesses that are lesser than, or greater than, the aforementioned thickness range may also be employed in the present application. The insulator layer 12 of the SOI substrate typically has a thickness from 1 nm to 200 nm. Other thicknesses that are lesser than, or greater than, the aforementioned thickness range may also be used as the thickness of the insulator layer 12. The thickness of the handle substrate 10 of the SOI substrate is inconsequential to the present application.

In some embodiments of the present application (not shown), the semiconductor material layer 14 can be processed into semiconductor material fins. Each semiconductor material fin which represents a remaining portion of the semiconductor material layer 14 extends upwards from a surface of insulator layer 12. Each semiconductor fin may be referred to herein as a semiconductor material portion. As used herein, a "semiconductor material fin" refers to a contiguous structure including a semiconductor material and including a pair of vertical sidewalls that are parallel to each other. As used herein, a surface is "vertical" if there exists a vertical plane from which the surface does not device by more than three times the root mean square roughness of the surface. In one embodiment of the present application, each semiconductor material fin has a height from 5 nm to 500 nm, a width from 5 nm to 30 nm, and a length from 100 nm to 2000 nm. Other heights, and/or widths, and/or lengths that are lesser than, or greater than, the aforementioned ranges may also be employed in the present application.

Each semiconductor material fin can be formed by patterning the semiconductor material layer 14. In one embodiment, patterning of the semiconductor material layer 14 may be performed by lithography and etching. Lithography includes forming a photoresist material (not shown) atop the semiconductor material layer 14. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion the semiconductor material layer 14. The pattern provided by the patterned photoresist material is thereafter transferred into the underlying semiconductor material layer 14 utilizing at least one pattern transfer etching process; the etch stops either on a surface of the insulator layer 12 or within a bottom material portion of a bulk semiconductor substrate. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment of the present application, a sidewall image transfer (SIT) process can be used in providing each semiconductor material fin. The SIT process includes forming a contiguous mandrel material layer (not shown) atop the semiconductor material layer 14. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying layers stopping atop the insulator layer 12 or within a bottom material portion of a bulk semiconductor substrate. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Figure 2:
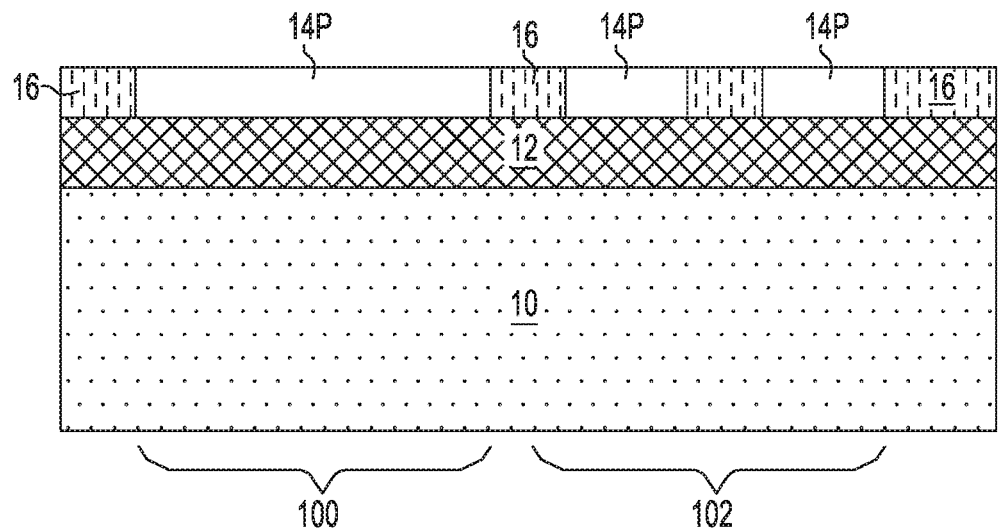
FIG. 2 is a cross sectional view of the exemplary semiconductor structure of FIG. 1 after forming trench isolation structures within a semiconductor material layer of the SOI substrate to provide a field effect transistor device region and at least one anti-fuse device region.

Referring now FIG. 2, there is illustrated the exemplary semiconductor structure of FIG. 1 after forming trench isolation structures 16 within the semiconductor material layer 14 of the SOI substrate to provide a field effect transistor device region 100 and an anti-fuse device region 102.

The trench isolation structures 16 can be formed in the present application by first providing a trench (not shown) within the semiconductor material layer 14. The trench can be formed by lithography and etching, as defined above; i.e., by patterning the semiconductor material layer 14. Portions of the semiconductor material layer 14 remain after trench definition. Each remaining portion may be referred to herein as semiconductor material portion 14P. Following trench definition, a trench dielectric material such as, for example, silicon dioxide, is then formed into each trench. The trench dielectric material can be formed utilizing a deposition process such as, for example, chemical vapor deposition (CVD) or plasma enhanced chemical vapor deposition (PECVD). After deposition of the trench dielectric material into each trench, a planarization process or an etch back process can be used in providing the trench isolation structures 16.

In some embodiments and as shown, each trench isolation structure 16 has a topmost surface that is coplanar with a topmost surface of each semiconductor material portion 14P. In other embodiments (not shown), each trench isolation structure 16 has a topmost surface that is located above or beneath a topmost surface of each semiconductor material portion 14P.

In some embodiments and when semiconductor material fins are formed, a trench dielectric material can be formed between each semiconductor material fin. After deposition of the trench dielectric material, an etch back process can be used to form trench isolation structures on the exposed surface of the insulator layer 12 and at a footprint of each semiconductor material fin. The resultant structure would look similar to the exemplary semiconductor structure shown in FIG. 2 except that the height of the semiconductor material portions (i.e., semiconductor material fins) would be greater than the height of the isolation structure such that sidewall surfaces and a topmost surface of each semiconductor fin are exposed.

Figure 3:
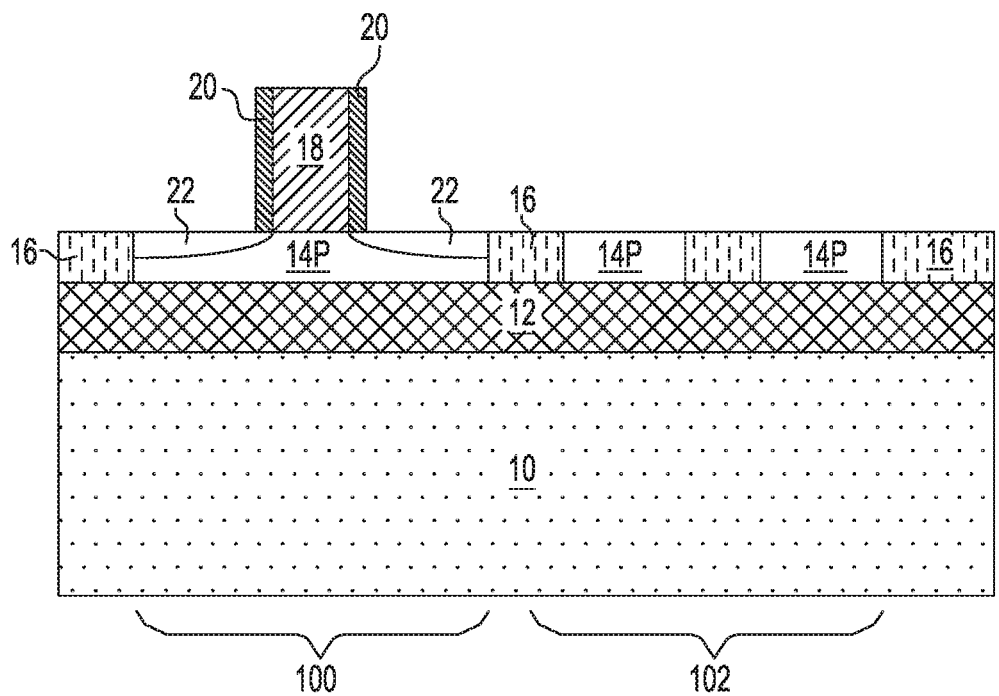
FIG. 3 is a cross sectional view of the exemplary semiconductor structure of FIG. 2 after forming a sacrificial gate structure containing a dielectric spacer on a semiconductor material portion of the SOI substrate within the field effect transistor device region.

Referring now to FIG. 3, there is illustrated the exemplary semiconductor structure of FIG. 2 after forming a sacrificial gate structure 18 containing a dielectric spacer 20 on a semiconductor material portion 14P within the field effect transistor device region 100. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface.

The sacrificial gate structure 18 may include a sacrificial gate dielectric portion, a sacrificial gate material portion and a sacrificial gate cap portion. In some embodiments, the sacrificial gate dielectric portion and/or the sacrificial gate cap portion may be omitted.

The sacrificial gate dielectric portion includes an oxide, nitride, and/or oxynitride. In one example, the sacrificial gate dielectric portion may be composed of silicon dioxide and/or silicon nitride. The sacrificial gate dielectric portion can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the sacrificial gate dielectric portion can have a thickness in a range from 1 nm to 10 nm. Other thicknesses that are lesser than, or greater than, the aforementioned thickness range can also be employed for the sacrificial gate dielectric portion.

The sacrificial gate material portion may include polysilicon or an elemental metal. The sacrificial gate material portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, sacrificial gate material portion has a thickness from 50 nm to 100 nm. Other thicknesses that are lesser than, or greater than, the aforementioned thickness range can also be employed for sacrificial gate material portion.

If present, the sacrificial gate cap portion may comprise silicon dioxide, silicon nitride, and/or silicon oxynitride. The material that provides the sacrificial gate cap portion can be formed utilizing a conventional deposition process such as, for example, chemical vapor deposition or plasma enhanced chemical vapor deposition. The material that provides the sacrificial gate cap portion can has a thickness from 5 nm to 20 nm. Other thicknesses that are lesser than, or greater than, the aforementioned thickness range can also be employed as the thickness of the material that provides the sacrificial gate cap portion.

The sacrificial gate structure 18 can be formed by deposition of the various sacrificial material layers and then patterning the resultant sacrificial material stack by utilizing, for example, lithography and etching.

Dielectric spacer 20 is provided on the exposed sidewalls of the sacrificial gate structure 18 and on a surface of the semiconductor material portion 14P within the field effect transistor device region 100. The dielectric spacer 20 may comprise one of the dielectric materials mentioned above for dielectric spacers used in the SIT process. The dielectric spacer 20 can be formed by depositing a spacer material and thereafter a spacer etch can be performed.

After dielectric spacer 20 formation, source/drain regions 22 may be formed into the exposed portions of the semiconductor material portion 14P within the field effect transistor device region 100. The source/drain regions 22 may be formed by implanting n-type or p-type dopants within the exposed portions of the semiconductor material portion 14P within the field effect transistor device region 100; a block mask can be used to protect the anti-fuse device region 102 during the formation of the source/drain regions 22. The term "n-type" denotes impurities that when added to an intrinsic semiconductor material contribute free electrons to the intrinsic semiconductor material. For silicon, n-type dopants include at least one element from Group VA of the Periodic Table of Elements (e.g., P and/or As). The term "p-type" refers impurities that when added to an intrinsic semiconductor material create deficiencies of valence electrons. For a silicon, p-type dopants include at least one element from Group IIIA of the Periodic Table of Elements (e.g., Al and/or B).

Figure 4:
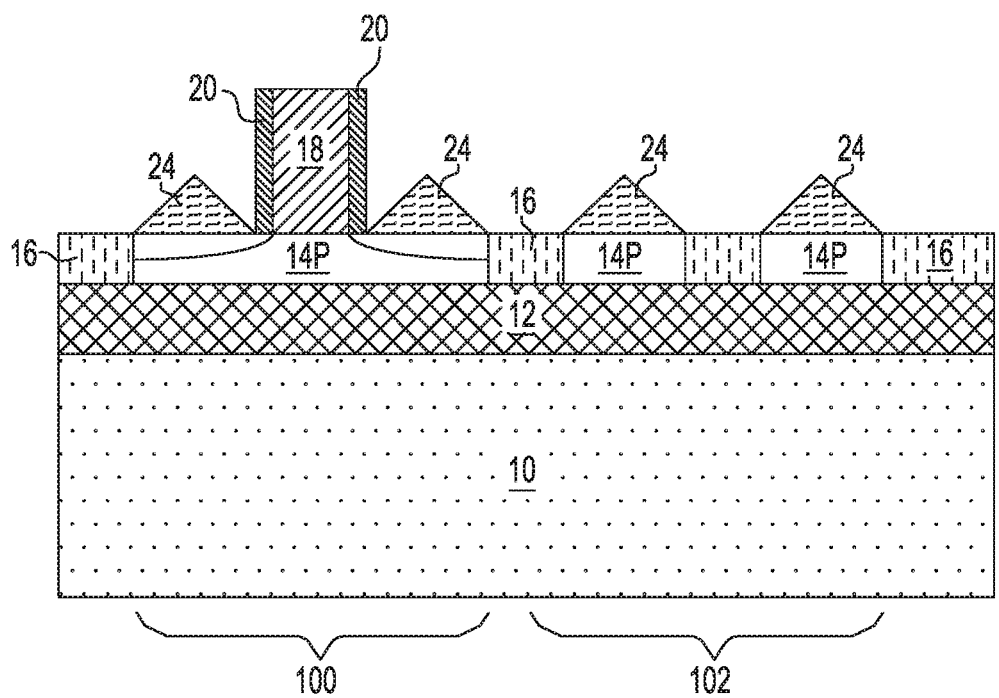
FIG. 4 is a cross sectional view of the exemplary semiconductor structure of FIG. 3 after forming faceted epitaxial doped semiconductor material structures on exposed portions of the semiconductor material portions of the SOI substrate within the field effect transistor device region and the anti-fuse device region.

Referring now to FIG. 4, there is illustrated the exemplary semiconductor structure of FIG. 3 after forming faceted epitaxial doped semiconductor material structures 24 on exposed portions of the semiconductor material portions 14P of the SOI substrate within the field effect transistor device region 100 and the anti-fuse device region 102.

Each faceted epitaxial doped semiconductor material structure 24 is formed utilizing a selective epitaxially growth (or deposition) process from exposed surfaces of each semiconductor material portion 14P. Each faceted epitaxial doped semiconductor material structure 24 has a non planar topmost surface. In some embodiments of the present application and as is shown, each faceted epitaxial doped semiconductor material structure 24 is triangularly shaped. In such an embodiment, the base of each triangularly shaped faceted epitaxial doped semiconductor material structure 24 directly contacts a surface of the semiconductor material portion 14P, and the apex of the each triangularly shaped faceted epitaxial doped semiconductor material structure 24 extends upward from the surface of semiconductor material portion 14P.

Each faceted epitaxial doped semiconductor material structure 24 includes an n-type or a p-type dopant and a semiconductor material. The semiconductor material of each faceted epitaxial doped semiconductor material structure 24 may include any of the semiconductor materials mentioned above for semiconductor material layer 14. In one embodiment of the present application, the semiconductor material of each faceted epitaxial doped semiconductor material structure 24 is a same semiconductor material as that of semiconductor material layer 14. In another embodiment, the semiconductor material of each faceted epitaxial doped semiconductor material structure 24 is a different semiconductor material than semiconductor material layer 14. For example, when semiconductor material layer 14 is comprised of silicon, then each faceted epitaxial doped semiconductor material structure 24 may be comprised of SiGe.

Each faceted epitaxial doped semiconductor material structure 24 can be formed by a selective epitaxial growth process; by "selective" it is meant that the epitaxial semiconductor material forms only on exposed surfaces of semiconductor material, i.e., the semiconductor material portions 14P, and not on dielectric surfaces, such as silicon dioxide or silicon nitride surfaces. In some embodiments, the selective epitaxial growth process is an in-situ doped selective epitaxial doped process. In such an embodiment, a dopant source gas is introduced during the deposition process. In some other embodiments, the selective epitaxial growth process forms an epitaxial semiconductor material that is intrinsic (i.e., non-doped) and the dopants can be introduced after deposition by one of ion implantation or gas phase doping.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, each faceted epitaxial doped semiconductor material structure 24 has an epitaxial relationship with the growth surface of the underlying semiconductor material portion 14P.

Examples of various epitaxial growth process apparatuses that are suitable for use in forming faceted epitaxial doped semiconductor material structure 24 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for typically ranges from 550° C. to 900° C. Although higher temperature typically results in faster deposition, the faster deposition may result in crystal defects and film cracking.

A number of different sources may be used for the deposition of each faceted epitaxial doped semiconductor material structure 24. In some embodiments, the gas source for the deposition of epitaxial semiconductor material includes a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In one embodiment, the dopant is present in each faceted epitaxial doped semiconductor material structure 24 in a concentration ranging from $1\times10^{19}$ atoms/cm$^3$ to $10^{21}$ atoms/cm$^3$. In one embodiment of the present application, the dopant can be uniformly present in each faceted epitaxial doped semiconductor material structure 24. In another of the present application, the dopant can be present as a gradient in each faceted epitaxial doped semiconductor material structure 24. The thickness of each faceted epitaxial doped semiconductor material structure 24 may range from 2 nm to 100 nm. Other thicknesses that are possible and are not excluded from being used.

Figure 5:
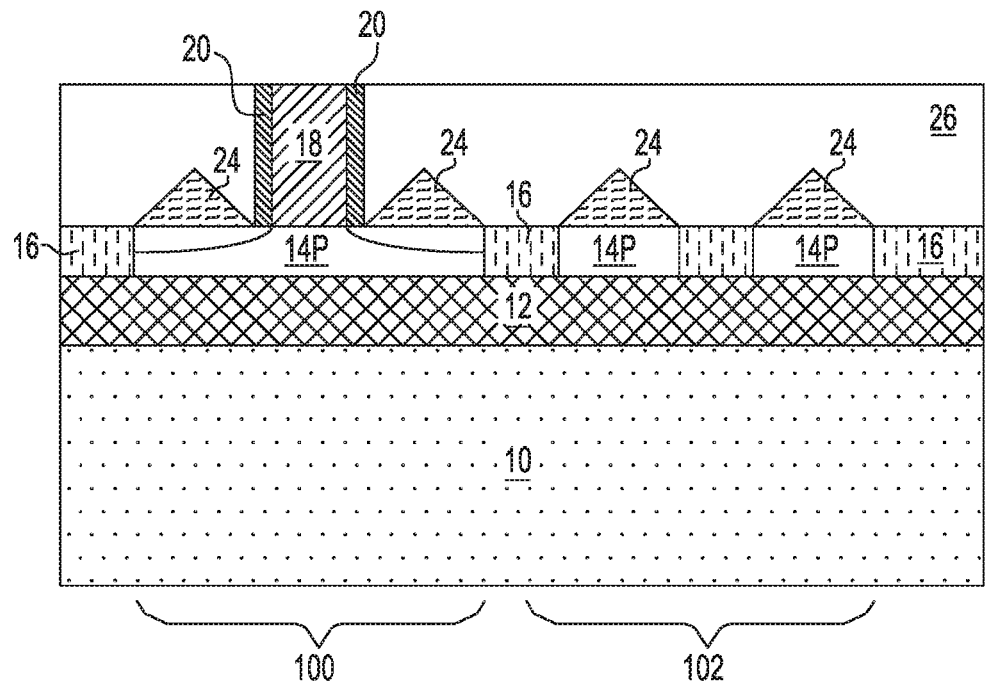
FIG. 5 is a cross sectional view of the exemplary semiconductor structure of FIG. 4 after forming a middle-of-the-line (MOL) dielectric within both the field effect transistor device region and the anti-fuse device region.

Referring now to FIG. 5, there is illustrated the exemplary semiconductor structure of FIG. 4 after forming a middle-of-the-line (MOL) dielectric 26 within both the field effect transistor device region 100 and the anti-fuse device region 102. The MOL dielectric 26 has a topmost surface that is coplanar with a topmost surface of the functional gate structure 18 and a topmost surface of the dielectric spacer 20 and is present on exposed surfaces of each faceted epitaxial doped semiconductor material structure 24 and atop exposed surfaces of the trench isolation structures 16.

In some embodiments, the MOL dielectric 26 may be composed of, for example, silicon dioxide, undoped silicate glass (USG), fluorosilicate glass (FSG), borophosphosilicate glass (BPSG), a spin-on low-k dielectric material, a chemical vapor deposition (CVD) low-k (k less than the dielectric constant of silicon dioxide) dielectric material or any combination thereof. In some embodiments, the MOL dielectric 26 may comprise a self-planarizing dielectric material such as, for example, a spin-on glass or a spin-on low-k dielectric material such as SiLK™. The use of a self-planarizing dielectric material as MOL dielectric 26 eliminates the need to perform a planarization step.

In one embodiment, the MOL dielectric 26 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as MOL dielectric 26, a planarization process or an etch back process follows the deposition of the dielectric material. The thickness of the MOL dielectric 26 that can be employed in the present application may vary depending on the type of dielectric material employed as well as the method that was employed in forming the same. In one embodiment, the v has a thickness from 80 nm to 500 nm. Other thicknesses that are greater or lesser than the range provided above can also be used for the MOL dielectric 26.

Figure 6:
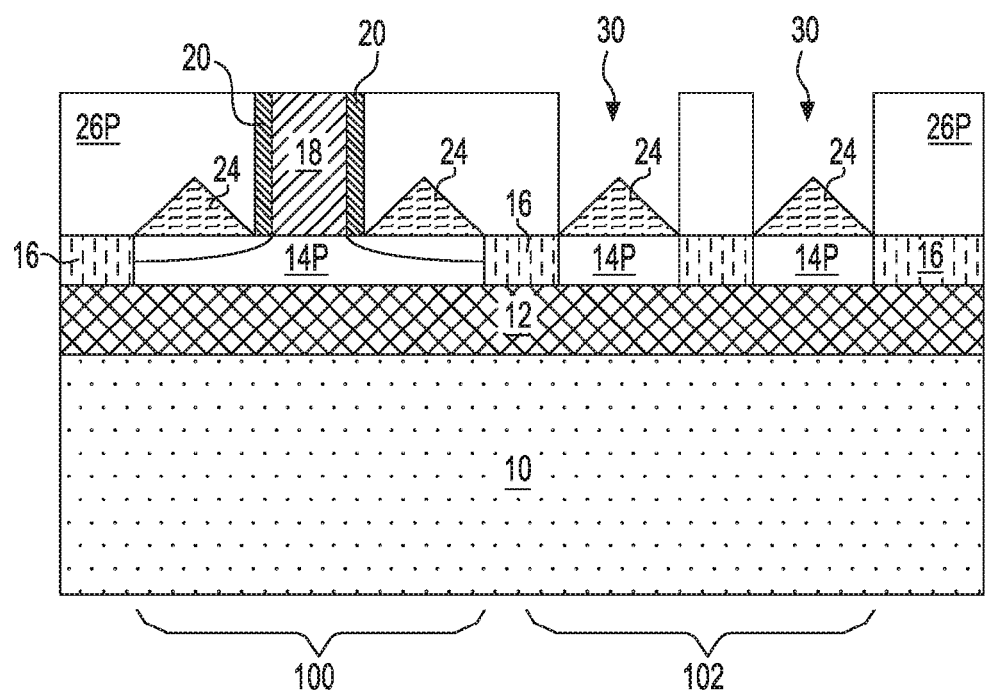
FIG. 6 is a cross sectional view of the exemplary semiconductor structure of FIG. 5 after removing portions of the ILD material atop each faceted epitaxial doped semiconductor material structure within the anti-fuse device region.

Referring now to FIG. 6, there is illustrated the exemplary semiconductor structure of FIG. 5 after removing portions of the ILD material 26 atop each faceted epitaxial doped semiconductor material structure 24 within the anti-fuse device region 102. The remaining ILD material 26 may be referred to herein as ILD material portion 26P. The removing of portions of the ILD material 26 atop the faceted epitaxial doped semiconductor material structure 24 within the anti-fuse device region 102 provides opening 30 within the ILD material that exposes one of the faceted epitaxial doped semiconductor material structures 24 within the anti-fuse device region 102. The exemplary semiconductor structure shown in FIG. 6 can be formed by lithography and etching. The etch removes exposed portions of the ILD material 26 selective to the underlying faceted epitaxial doped semiconductor material structure 24. After etching, the patterned photoresist can be removed from atop the structure via ashing or any other conventional resist removal process.

Figure 7:
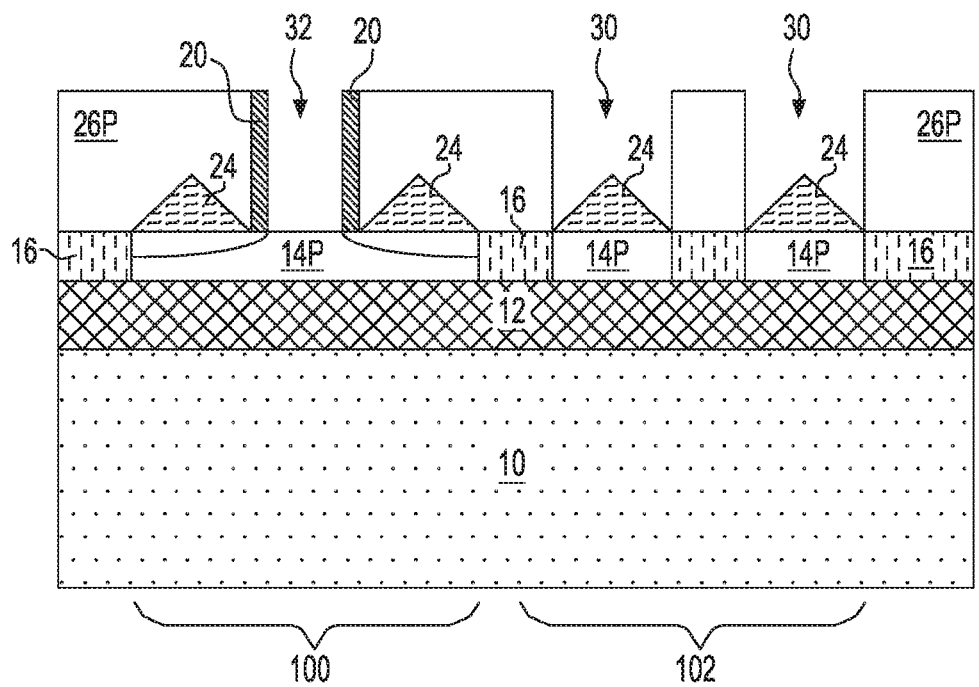
FIG. 7 is a cross sectional view of the exemplary semiconductor structure of FIG. 6 after removing the sacrificial gate structure and providing a gate cavity.

Referring now to FIG. 7, there is illustrated the exemplary semiconductor structure of FIG. 6 after removing the sacrificial gate structure 18 and providing a gate cavity 32. The sacrificial gate structure 18 can be removed utilizing an etching process that is selective in removing the sacrificial material or sacrificial materials that provide the sacrificial gate structure, stopping on a surface of the underlying semiconductor material portion 14P within the field effect transistor device region 100.

Figure 8:
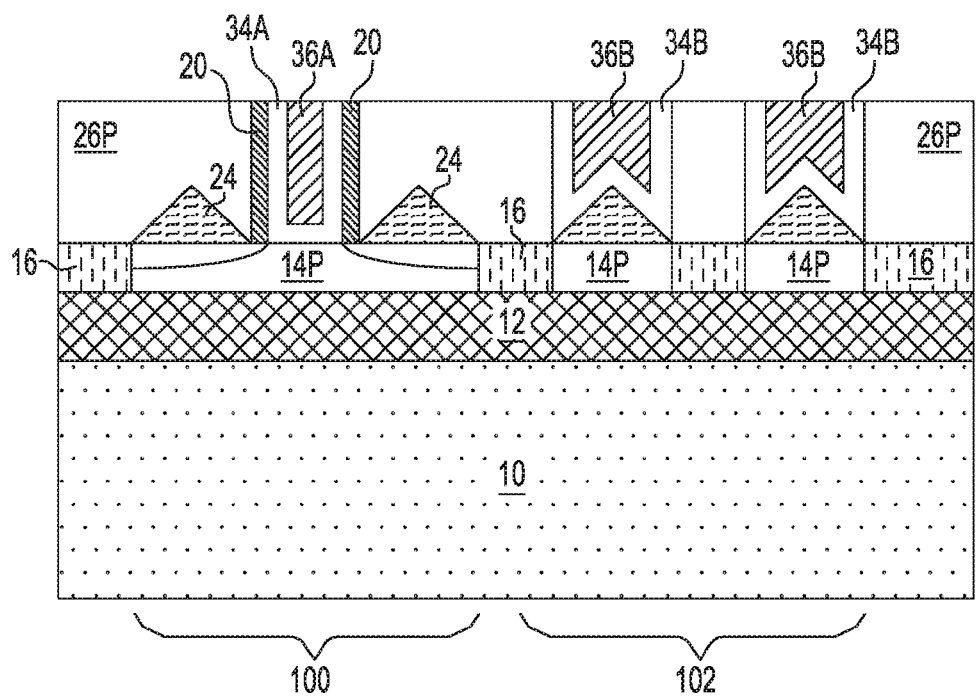
FIG. 8 is a cross sectional view of the exemplary semiconductor structure of FIG. 7 after forming a contiguous layer of a high k dielectric material and a contiguous layer of a gate electrode (i.e., conductor) material, and planarizing.

Referring now to FIG. 8, there is illustrated the exemplary semiconductor structure of FIG. 7 after forming a layer of a contiguous high k dielectric material within the field effect transistor device region 100 and the anti-fuse device region 102, then forming a contiguous layer of gate electrode (i.e., conductor) material atop the dielectric material and thereafter planarizing the gate dielectric material and the gate electrode material. This provides a functional gate structure within gate cavity 32, and an anti-fuse structure within opening 30. By "functional gate structure" it is meant a permanent gate structure used to control output current (i.e., flow of carriers in the channel) of a semiconducting device through electrical or magnetic fields.

The functional gate structure includes a first portion of the high k dielectric material 34A and a first portion of the gate electrode material 36A. The anti-fuse structure includes a second portion of the high k dielectric material 34B and a second portion of the gate electrode material 36B. In accordance with the present application, the first portion of the high k dielectric material 34A and the second portion of the high k dielectric material 34B comprise a same gate dielectric material, while the first portion of the gate electrode material 36A and the second portion of the gate electrode material 36B comprise a same gate conductor material.

The contiguous layer of high k dielectric material comprises any dielectric material having a dielectric constant of greater than the dielectric constant of silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The contiguous layer of high k dielectric material can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the contiguous layer of high k dielectric material can have a thickness in a range from 1 nm to 10 nm. Other thicknesses that are lesser than, or greater than, the aforementioned thickness range can also be employed for the contiguous layer of high k dielectric material that provides the first portion of high k dielectric material 34A and the second portion of high k dielectric material 34B.

The gate electrode material that provides the first portion of gate electrode material 36A and the second portion of gate electrode material 36B can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The gate electrode material used in providing the first portion of gate electrode material 36A and the second portion of gate electrode material 36B can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate electrode material used in providing the first portion of gate electrode material 36A and the second portion of gate electrode material 36B has a thickness from 1 nm to 100 nm. Other thicknesses that are lesser than, or greater than, the aforementioned thickness range can also be employed for the gate electrode material.

FIG. 8 illustrates one semiconductor structure of the present application. Notably, FIG. 8 includes a field effect transistor (34A, 36B) located on a first semiconductor material portion (i.e., the far left semiconductor material portion 14P) that is present on a first portion of a topmost surface of an insulator layer 12. The field effect transistor comprises a functional gate structure of, from bottom to top, a first portion of a high k dielectric material 34A and a first portion of a gate electrode material 36A. The structure of the present application further includes an anti-fuse structure (24, 34B, 36B) located on a second semiconductor material portion (i.e., the middle semiconductor material portion 14P) that is present on a second portion of the topmost surface of the insulator layer 12. The anti-fuse structure comprises, from bottom to top, a faceted epitaxial doped semiconductor material structure 24, a second portion of the high k dielectric material 34B and a second portion of the gate electrode material 36B. In the illustrated embodiment shown in FIG. 8, the topmost surfaces of the first portion of the high k dielectric material 34A, the first portion of the gate electrode material 36A, the second portion of the high k dielectric material 34B, and the second portion of the gate electrode material 36B are coplanar with one another.

Still referring to FIG. 8, the exemplary semiconductor structure further includes another anti-fuse structure located on a third semiconductor material portion (i.e., the far right semiconductor material portion 14P). The third semiconductor material portion is present on a third portion of the topmost surface of the insulator layer 12. The another anti-fuse structure comprises, from bottom to top, another faceted epitaxial doped semiconductor material structure 24, another portion of the high k dielectric material 34B and another portion of the gate electrode material 36B. In this embodiment, the two anti-fuse structures are separated by a middle-of-the-line dielectric portion 26P that is present directly above a trench isolation structure 16.

Figure 9:
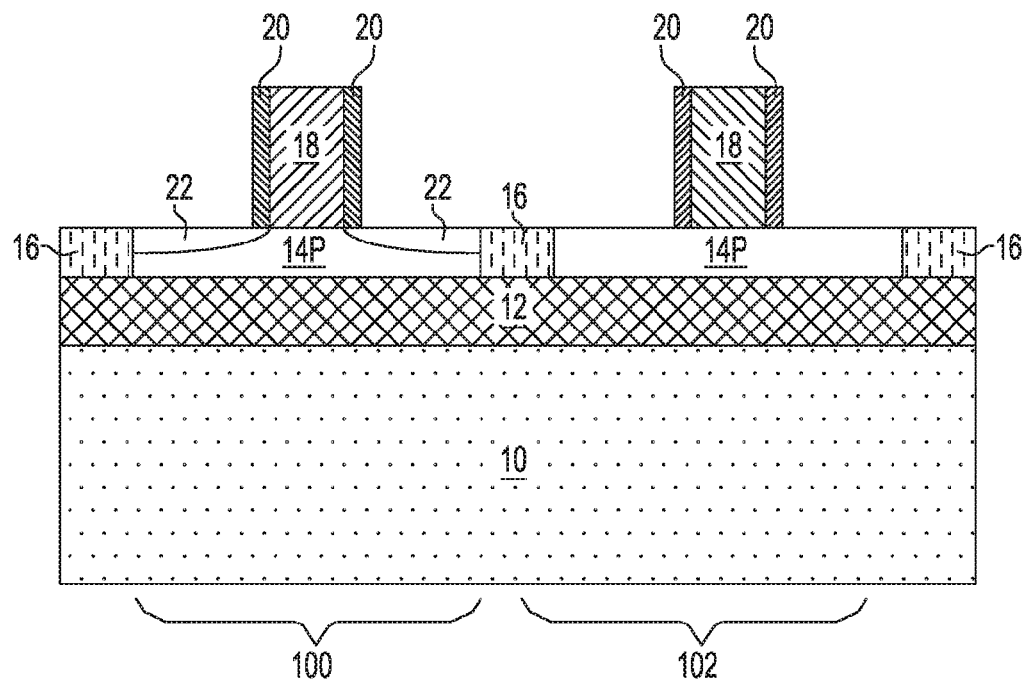
FIG. 9 is a cross sectional view of another exemplary semiconductor structure after forming a sacrificial gate structure containing a dielectric spacer on a semiconductor material portion of the SOI substrate within both a field effect transistor device region and an anti-fuse device region in accordance with another embodiment of the present application.

Referring now to FIG. 9, there is illustrated another exemplary semiconductor structure of the present application after forming a sacrificial gate structure 18 containing a dielectric spacer 20 on a semiconductor material portion 14P of the SOI substrate within both a field effect transistor device region 100 and an anti-fuse device region 102 in accordance with another embodiment of the present application. The structure shown in FIG. 9 can be formed utilizing the processing steps and materials mentioned above in providing the structures shown in FIGS. 1-3 of the present application.

Figure 10:
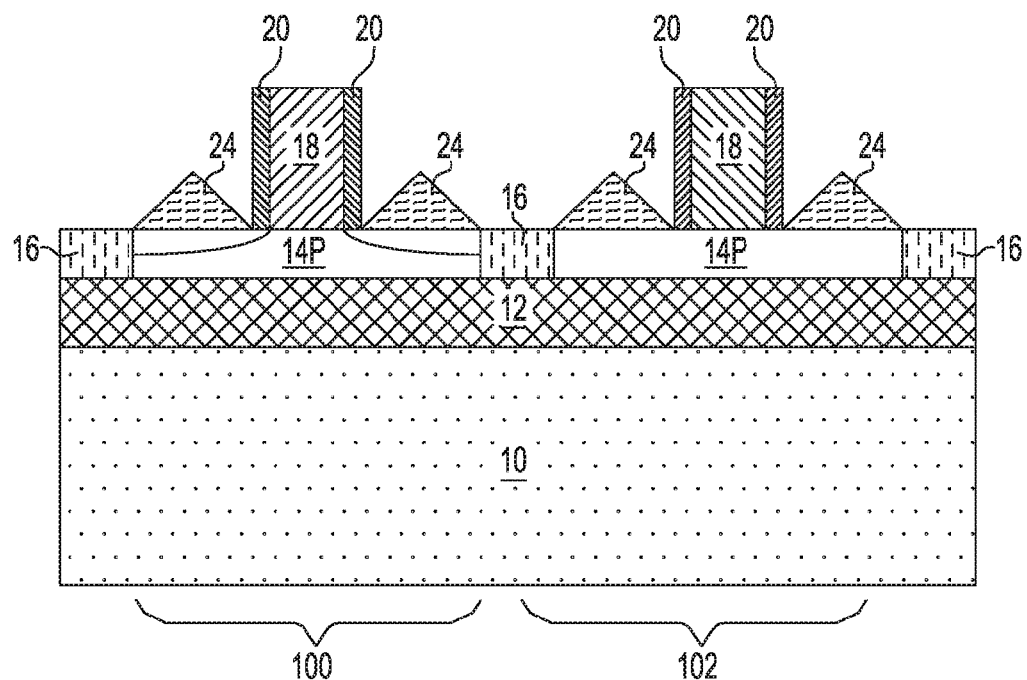
FIG. 10 is a cross sectional view of the exemplary semiconductor structure of FIG. 9 after forming faceted epitaxial doped semiconductor material structures on exposed portions of the semiconductor material portions of the SOI substrate within the field effect transistor device region and the anti-fuse device region.

Referring now to FIG. 10, there is illustrated the exemplary semiconductor structure of FIG. 9 after forming faceted epitaxial doped semiconductor material structures 24 on exposed portions of the semiconductor material portions 14P of the SOI substrate within the field effect transistor device region 100 and the anti-fuse device region 102. Each faceted epitaxial doped semiconductor material structure 24 can be formed and include materials and dopants as mentioned above.

Figure 11:
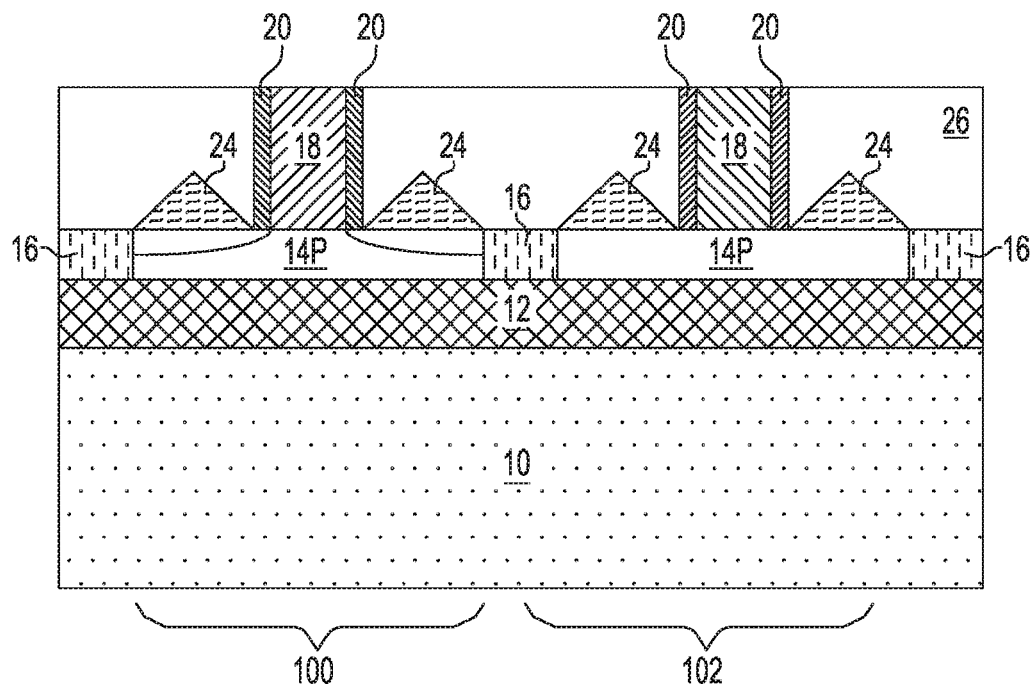
FIG. 11 is a cross sectional view of the exemplary semiconductor structure of FIG. 10 after forming a middle-of-the-line (MOL) dielectric within both the field effect transistor device region and the anti-fuse device region.

Referring now to FIG. 11, there is illustrated the exemplary semiconductor structure of FIG. 10 after forming a middle-of-the-line (MOL) dielectric 26 within both the field effect transistor device region 100 and the anti-fuse device region 102. The MOL dielectric 26 can be formed and include materials as mentioned above.

Figure 12:
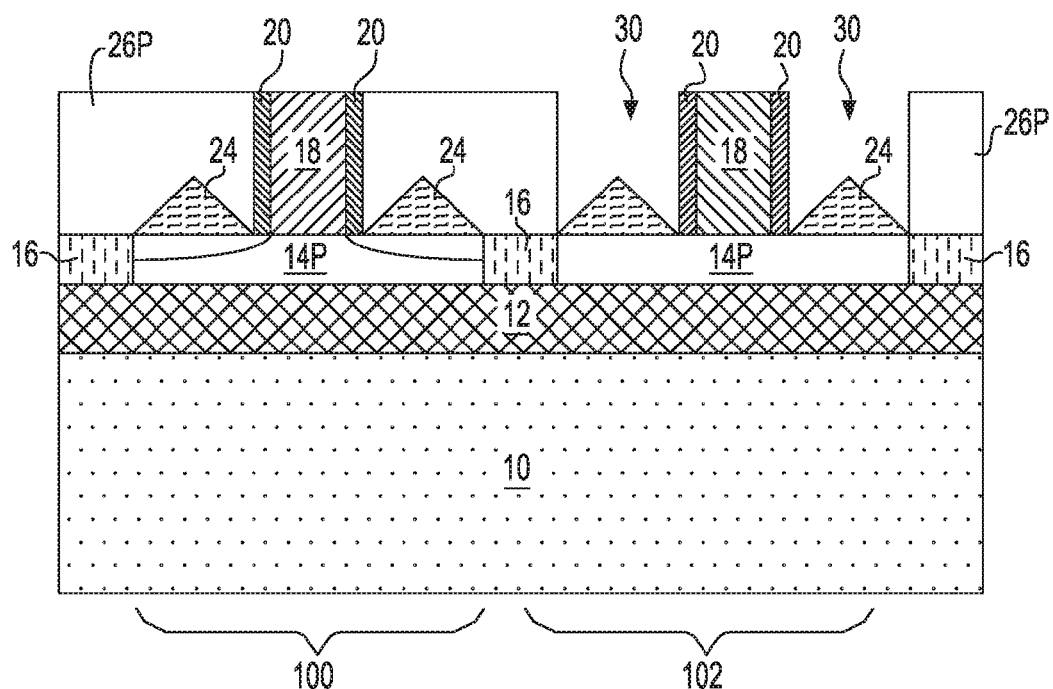
FIG. 12 is a cross sectional view of the exemplary semiconductor structure of FIG. 11 after removing portions of the ILD material atop the faceted epitaxial doped semiconductor material structures within the anti-fuse device region.

Referring now to FIG. 12, there is illustrated the exemplary semiconductor structure of FIG. 11 after removing portions of the ILD material 26 atop the faceted epitaxial doped semiconductor material structures 24 within the anti-fuse device region 102. The removal of portions of the ILD material 26 can be performed utilizing an etch as defined above in providing the exemplary semiconductor structure in FIG. 6.

Figure 13:
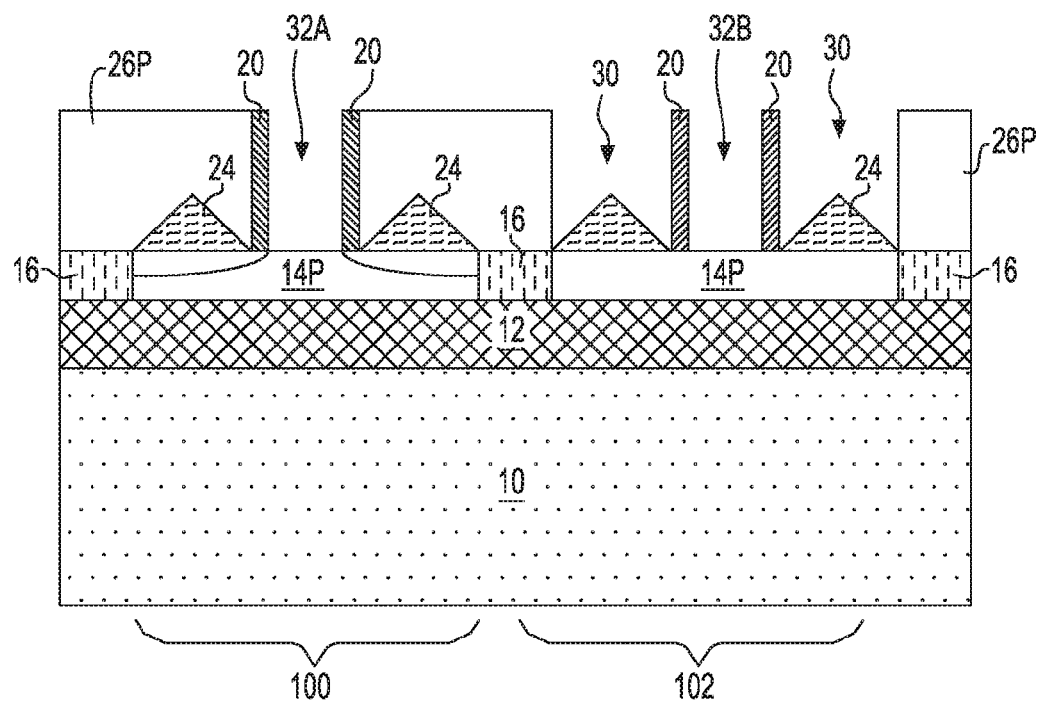
FIG. 13 is a cross sectional view of the exemplary semiconductor structure of FIG. 12 after removing the sacrificial gate structure from the field effect transistor region providing a first gate cavity, and after removing the sacrificial gate structure from the anti-fuse device region providing a second gate cavity.

Referring now to FIG. 13, there is illustrated the exemplary semiconductor structure of FIG. 12 after removing the sacrificial gate structure 18 from the field effect transistor region 100 providing a first gate cavity 32A, and removing the sacrificial gate structure 18 from the anti-fuse field effect transistor region 102 providing a second gate cavity 32B. The sacrificial gate structures 18 can be removed utilizing an etching process that is selective in removing the sacrificial material or sacrificial materials that provide the sacrificial gate structure, stopping on a surface of the underlying semiconductor material portion 14P within the field effect transistor device region 100 and the anti-fuse device region 102.

Figure 14:
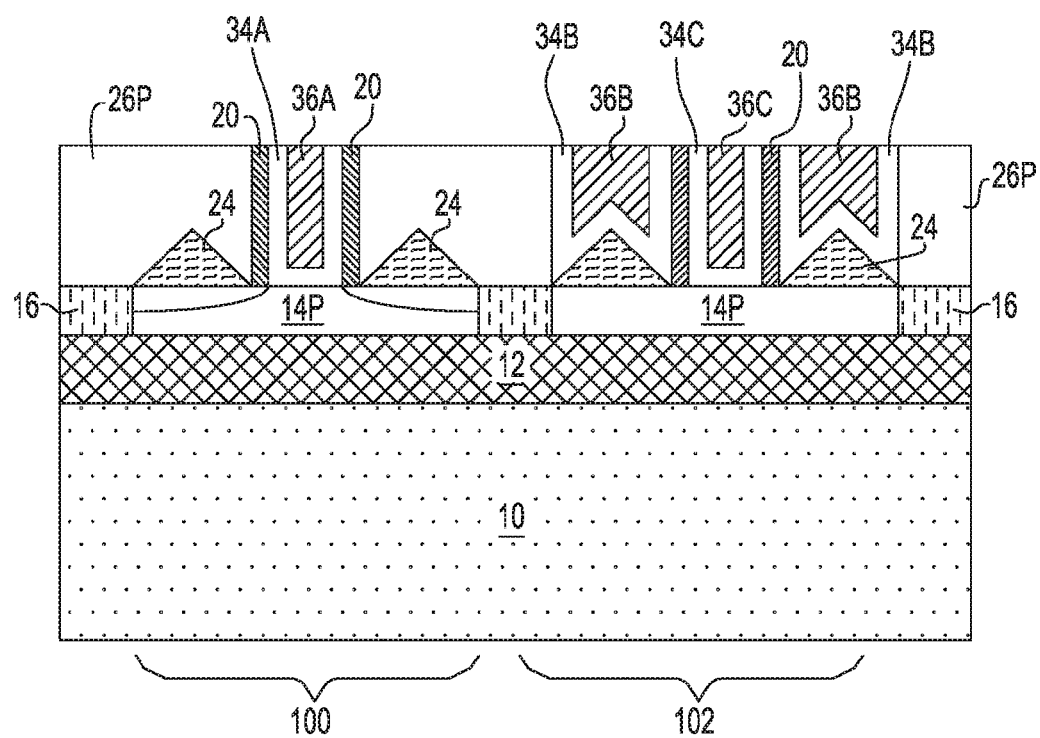
FIG. 14 is a cross sectional view of the exemplary semiconductor structure of FIG. 13 after forming a contiguous layer of a high k dielectric material and a contiguous layer of a gate electrode material, and planarizing.

Referring now to FIG. 14, there is illustrated the exemplary semiconductor structure of FIG. 13 after forming a contiguous layer of a high k dielectric material and a contiguous layer of a gate electrode material, and planarizing. This provides a functional gate structure within first gate cavity 32A, an anti-fuse structure within opening 30, and a non-function gate structure within the second gate cavity 32B. By "functional gate structure" it is meant a permanent gate structure used to control output current (i.e., flow of carriers in the channel) of a semiconducting device through electrical or magnetic fields. By "non-functional gate structure" it is meant a permanent gate structure that is not used to control output current of a semiconducting device through electrical or magnetic fields.

The functional gate structure includes a first portion of the high k dielectric material 34A and a first portion of the gate electrode material 36A. The anti-fuse structure includes a second portion of the high k dielectric material 34B and a second portion of the gate electrode material 36B. The non-functional gate structure includes a third portion of the high k dielectric material 34C and a third portion of the gate electrode material 36C. In accordance with the present application, the first portion of the high k dielectric material 34A, the second portion of the high k dielectric material 34B and the third portion of the high k dielectric material 34C comprise a same gate dielectric material, while the first portion of the gate electrode material 36A, the second portion of the gate electrode material 36B and the third portion of the gate electrode material 36C comprise a same gate conductor material.

In this embodiment, elements 34A, 34B and 36C are formed from a contiguous gate dielectric material as mentioned above, and elements 36A, 36B and 36C are formed from a contiguous gate electrode material as mentioned above. The processing and materials mentioned above in forming the exemplary structure shown in FIG. 8 can be used to provide the exemplary structure shown in FIG. 14.

FIG. 14 illustrates another semiconductor structure of the present application. Notably, FIG. 14 includes a field effect transistor (34A, 36B) located on a first semiconductor material portion (i.e., the left semiconductor material portion 14P) that is present on a first portion of a topmost surface of an insulator layer 12. The field effect transistor comprises a functional gate structure of, from bottom to top, a first portion of a high k dielectric material 34A and a first portion of a gate electrode material 36A. The structure of the present application further includes an anti-fuse structure (i.e., the first one from the left including element 24, 34B, 36B) located on a second semiconductor material portion (i.e., the right semiconductor material portion 14P) that is present on a second portion of the topmost surface of the insulator layer 12. The anti-fuse structure comprises, from bottom to top, a faceted epitaxial doped semiconductor material structure 24, a second portion of the high k dielectric material 34B and a second portion of the gate electrode material 36B. In the illustrated embodiment shown in FIG. 14, the topmost surfaces of the first portion of the high k dielectric material 34A, the first portion of the gate electrode material 36A, the second portion of the high k dielectric material 34B, and the second portion of the gate electrode material 36B are coplanar with one another.

Still referring to FIG. 14, the exemplary semiconductor structure further includes another anti-fuse structure (i.e., the second one also including elements 24, 34B, 36B) located on the second semiconductor material portion. The another anti-fuse structure comprises, from bottom to top, another faceted epitaxial doped semiconductor material structure 24, another portion of the high k dielectric material 34B and another portion of the gate electrode material 26B. The two anti-fuse structures shown in FIG. 14 are separated by a non-functional gate structure including elements 34C and 36C. Dielectric spacer 20 may be present between a sidewall surface of the non-functional gate structure and a sidewall surface of each anti-fuse structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   providing a substrate including a first semiconductor material portion located on a first portion of a topmost surface of an insulator layer, and a second semiconductor material portion located on a second portion of the topmost surface of the insulator layer;
   forming a sacrificial gate structure on a surface of the first semiconductor material portion;

forming faceted epitaxial doped semiconductor material structures on exposed portions of the first semiconductor material portion and on exposed portions of the second semiconductor material portion;

forming a middle-of-the-line (MOL) dielectric surrounding the sacrificial gate structure and atop the faceted epitaxial doped semiconductor material structures, the first semiconductor material portion and the second semiconductor material portion;

forming an opening within the MOL dielectric exposing the faceted epitaxial doped semiconductor material structure on the second semiconductor material portion;

removing the sacrificial gate structure to provide a gate cavity; and forming a contiguous layer of a high k dielectric material and a contiguous layer of gate electrode material within the gate cavity and the opening and atop the MOL dielectric; and removing portions of the contiguous layer of the high k dielectric material and portions of the contiguous layer of gate electrode material from atop the MOL dielectric to provide a functional gate structure in the gate cavity and an anti-fuse structure in the opening.

2. The method of claim 1, wherein the forming the sacrificial gate structure on the surface of the first semiconductor material portion comprises forming another sacrificial gate structure on a surface of the second semiconductor material portion.

3. The method of claim 2, wherein the another sacrificial gate structure is simultaneously removing during the removing the sacrificial gate structure to provide the another gate cavity.

4. The method of claim 3, wherein the removing portions of the contiguous layer of the high k dielectric material and portions of the contiguous layer of gate electrode material from atop the MOL dielectric provides a non-functional gate structure in the another cavity.

5. The method of claim 1, wherein the functional gate structure comprises, from bottom to top, a first portion of the high k dielectric material and a first portion of the gate electrode material.

6. The method of claim 5, wherein the anti-fuse structure comprises, from bottom to top, one or the faceted epitaxial doped semiconductor material structures, a second portion of the high k dielectric material and a second portion of the gate electrode material.

7. The method of claim 6, wherein topmost surfaces of the first portion of the high k dielectric material, the first portion of the gate electrode material, the second portion of the high k dielectric material, and the second portion of the gate electrode material are coplanar with one another.

8. The method of claim 1, wherein the forming the faceted epitaxial doped semiconductor material structures comprises an epitaxial growth process.

9. The method of claim 8, wherein the epitaxial growth process is a selective epitaxial growth process.

10. The method of claim 1, wherein the faceted epitaxial doped semiconductor material structures have a triangular shape.

11. The method of claim 1, wherein the providing the substrate comprises:
providing a semiconductor-on-insulator substrate including from bottom to top, a handle substrate, the insulator layer, and a semiconductor material layer;
patterning the semiconductor material layer to provide the first and second semiconductor material portions.

12. The method of claim 11, wherein the patterning comprises a sidewall image transfer process.

13. The method of claim 11, further comprising forming a trench isolation structure between the first and second semiconductor material portions.

14. The method of claim 13, wherein the trench isolation structure has a topmost surface that is coplanar with a topmost surface of each of the first and second semiconductor material portions.

15. The method of claim 1, wherein each of the first and second semiconductor material portions comprises a single crystalline semiconductor.

16. The method of claim 1, wherein a dielectric spacer is present on the sacrificial gate structure.

17. The method of claim 1, wherein each of the first and second semiconductor material portions are semiconductor fins.

18. The method of claim 1, wherein each of the faceted epitaxial doped semiconductor material structures comprises a semiconductor material that is doped with an n-type dopant or a p-type dopant.

19. The method of claim 1, wherein each of the first and second semiconductor material portions comprises a first semiconductor material, and each of the faceted epitaxial doped semiconductor material structures comprises a second semiconductor material that differs from the first semiconductor material.

20. The method of claim 19, wherein the first semiconductor material comprises silicon, and the second semiconductor material comprises a silicon germanium alloy.

* * * * *